(12) United States Patent
Park et al.

(10) Patent No.: US 11,041,097 B2
(45) Date of Patent: Jun. 22, 2021

(54) POLISHING COMPOSITION AND METHOD OF FABRICATING SEMICONDUCTOR DEVICE USING THE SAME

(71) Applicant: SAMSUNG ELECTRONICS CO., LTD., Suwon-si (KR)

(72) Inventors: Kyung-il Park, Suwon-si (KR); Myeong Hoon Han, Sungnam-si (KR); Sanghyun Park, Hwasung-si (KR); Wonki Hur, Suwon-si (KR); Seungho Park, Suwon-si (KR); Hao Cui, Suwon-si (KR)

(73) Assignees: SAMSUNG ELECTRONICS CO., LTD., Suwon-si (KR); Soulbrain Co., Ltd., Seongnam-si (KR)

( * ) Notice: Subject to any disclaimer, the term of this patent is extended or adjusted under 35 U.S.C. 154(b) by 0 days.

(21) Appl. No.: 16/661,287

(22) Filed: Oct. 23, 2019

(65) Prior Publication Data

US 2020/0255689 A1 Aug. 13, 2020

(30) Foreign Application Priority Data

Feb. 11, 2019 (KR) .................... 10-2019-0015471

(51) Int. Cl.
*C09G 1/02* (2006.01)
*H01L 27/24* (2006.01)
*H01L 45/00* (2006.01)

(52) U.S. Cl.
CPC ............ *C09G 1/02* (2013.01); *H01L 27/2427* (2013.01); *H01L 27/2463* (2013.01); *H01L 45/06* (2013.01); *H01L 45/144* (2013.01); *H01L 45/1641* (2013.01); *H01L 45/1683* (2013.01)

(58) Field of Classification Search
CPC ...................................................... C09G 1/02
See application file for complete search history.

(56) References Cited

U.S. PATENT DOCUMENTS

| | | | |
|---|---|---|---|
| 7,915,071 B2 | 3/2011 | Siddiqui et al. | |
| 9,390,938 B2 | 7/2016 | Yoshizaki | |
| 2008/0242091 A1* | 10/2008 | Kato | C09K 3/1463 438/693 |
| 2010/0267315 A1* | 10/2010 | Sato | C09G 1/02 451/36 |
| 2012/0049107 A1 | 3/2012 | Park et al. | |
| 2013/0112914 A1 | 5/2013 | Han et al. | |
| 2014/0008567 A1 | 1/2014 | Wang et al. | |

(Continued)

FOREIGN PATENT DOCUMENTS

JP 5945123 B2 7/2016
KR 10-2013-0049538 A 5/2013

(Continued)

OTHER PUBLICATIONS

"Parts-per notation", Wikipedia web page, no date.*

*Primary Examiner* — Thomas T Pham
(74) *Attorney, Agent, or Firm* — Lee IP Law, P.C.

(57) ABSTRACT

A polishing composition and a method of fabricating a semiconductor device using the same, the polishing composition including an abrasive; a first additive that includes a C5 to C30 hydrocarbon including an amide group and a carboxyl group or a C5 to C30 hydrocarbon including two or more amine groups; and a second additive that includes a sulfonic acid, a sulfonate, or a sulfonate salt.

17 Claims, 9 Drawing Sheets

(56) References Cited

U.S. PATENT DOCUMENTS

| | | |
|---|---|---|
| 2014/0024216 A1 | 1/2014 | Stender et al. |
| 2014/0170852 A1 | 6/2014 | Noller et al. |
| 2014/0242798 A1 | 8/2014 | Izawa et al. |
| 2016/0108284 A1 | 4/2016 | Yoshizaki |
| 2016/0108285 A1* | 4/2016 | Kraft ........................ C09G 1/02 438/693 |
| 2017/0207100 A1 | 7/2017 | Park et al. |

FOREIGN PATENT DOCUMENTS

| | | |
|---|---|---|
| KR | 10-2014-0059216 A | 5/2014 |
| KR | 10-2014-0072892 A | 6/2014 |
| KR | 10-2015-0036070 A | 4/2015 |
| KR | 10-2017-0085780 A | 7/2017 |

\* cited by examiner

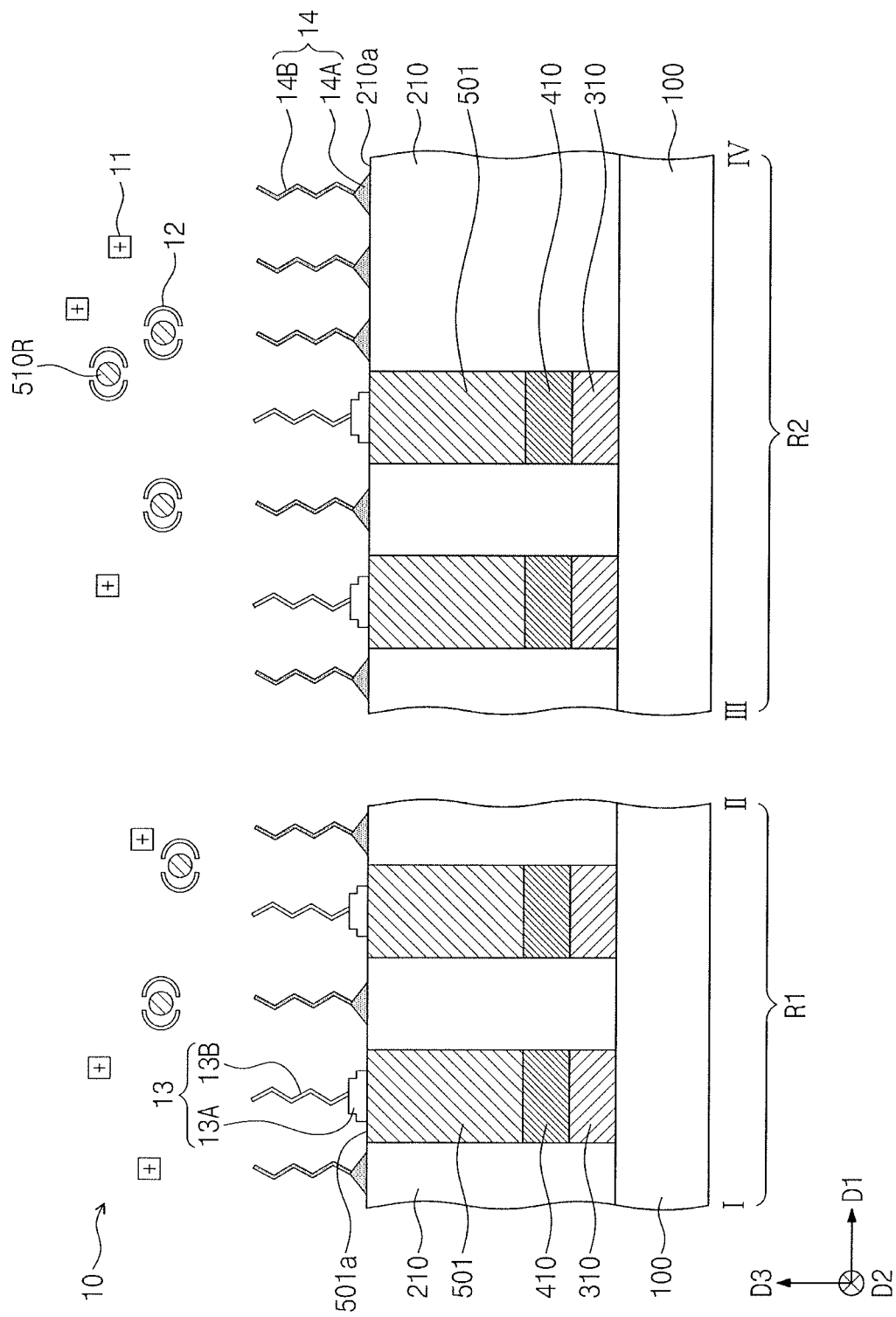

POLISHING COMPOSITION AND METHOD OF FABRICATING SEMICONDUCTOR DEVICE USING THE SAME

CROSS-REFERENCE TO RELATED APPLICATION

Korean Patent Application No. 10-2019-0015471, filed on Feb. 11, 2019, in the Korean Intellectual Property Office, and entitled: "Polishing Composition and Method of Fabricating Semiconductor Device Using the Same," is incorporated by reference herein in its entirety.

BACKGROUND

1. Field

Embodiments relate to a polishing composition and a method of fabricating a semiconductor device using the same.

2. Description of the Related Art

Increasing integration of semiconductor devices may provide high performance and low manufacturing cost.

For example, a chemical mechanical polishing process may be used to remove a certain layer during fabrication of semiconductor devices. A high polishing selectivity may exist between a polishing-target layer and other layers (e.g., non-polishing-target layers). A polishing composition may have high polishing selectivity.

SUMMARY

The embodiments may be realized by providing a polishing composition including an abrasive including one or more of silica and alumina; a first additive expressed by Chemical Formula 1 below; and a second additive that includes one or more of sulfonic acid, sulfonate, and sulfonate salt, a compositional ratio of the second additive falling within a range from 1 ppm to 100 ppm.

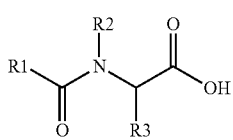

[Chemical Formula 1]

The embodiments may be realized by providing a polishing composition including an abrasive; a first additive that includes one or more of hydrocarbon of 5 to 30 carbon atoms including an amide group and a carboxyl group and hydrocarbon of 5 to 30 carbon atoms including two or more amine groups, a compositional ratio of the first additive falling within a range from 1 ppm to 100 ppm; and a second additive that includes one or more of sulfonic acid, sulfonate, and sulfonate salt, wherein a compositional ratio of the second additive falls within a range from 1 ppm to 100 ppm.

The embodiments may be realized by providing a polishing composition including an abrasive; a first additive that includes a C5 to C30 hydrocarbon including an amide group and a carboxyl group or a C5 to C30 hydrocarbon including two or more amine groups; and a second additive that includes a sulfonic acid, a sulfonate, or a sulfonate salt.

The embodiments may be realized by providing a method of fabricating a semiconductor device, the method including preparing a substrate on which a phase change layer is formed; and performing a polishing process on the phase change layer using a polishing composition, wherein the polishing composition includes an abrasive; a first additive that includes a C5 to C30 hydrocarbon including an amide group and a carboxyl group or a C5 to C30 hydrocarbon including two or more amine groups; and a second additive that includes a sulfonic acid, a sulfonate, or a sulfonate salt.

BRIEF DESCRIPTION OF THE DRAWINGS

Features will be apparent to those of skill in the art by describing in detail exemplary embodiments with reference to the attached drawings in which:

FIGS. 5A and 5B illustrate stages in a polishing process in which a phase change layer is polished with a polishing composition according to some example embodiments.

DETAILED DESCRIPTION

Figure 1:
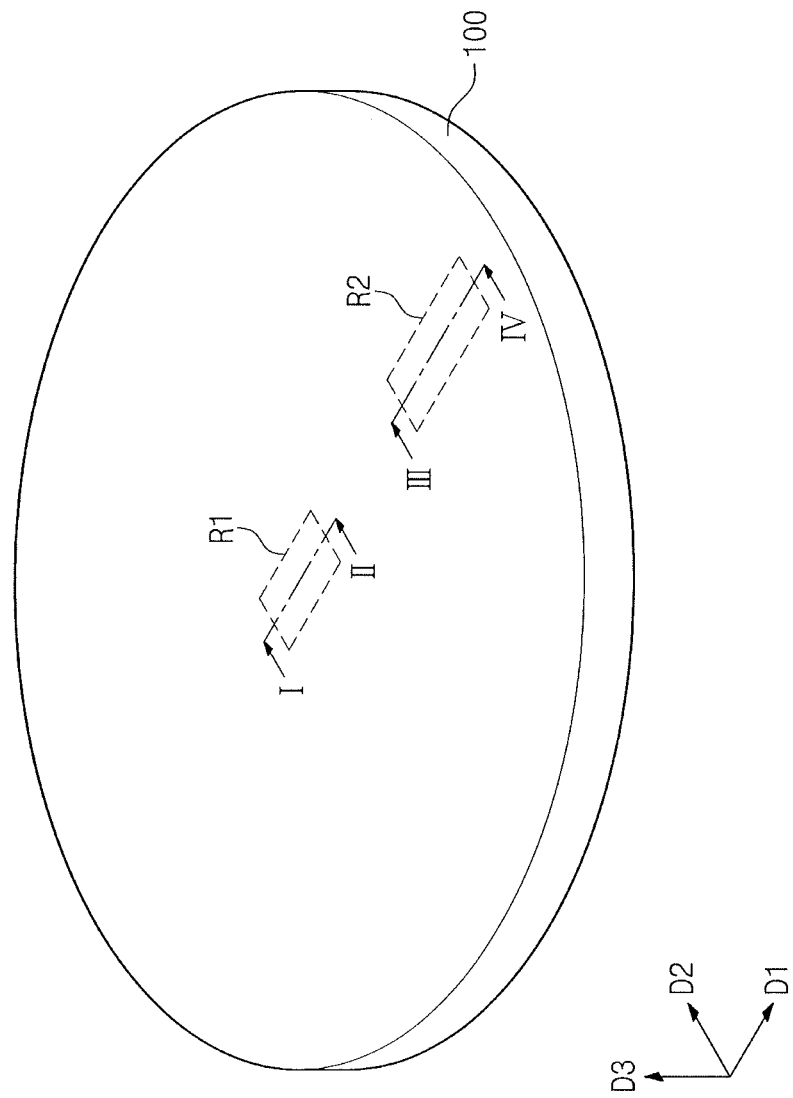
FIG. 1 illustrates a substrate according to some example embodiments.

In this description, the term "hydrocarbon" may include saturated hydrocarbon and unsaturated hydrocarbon. The hydrocarbon may include carbon and hydrogen and may further include elements or groups other than carbon and hydrogen, e.g., nitrogen or oxygen. Saturated hydrocarbon may include acyclic saturated hydrocarbon and cyclic saturated hydrocarbon. Unsaturated hydrocarbon may include acyclic unsaturated hydrocarbon and cyclic unsaturated hydrocarbon.

The term "substituted or unsubstituted" may mean unsubstituted or substituted with at least one substituent selected from a deuterium atom, halogen atom, cyano group, nitro group, amino group, oxide group, phosphine sulfide group, thiol group, carboxyl group, amine group, amide group, alkyl group, alkenyl group, aryl group, and heterocyclic group. For example, the term "substituted or unsubstituted" may mean unsubstituted or substituted with at least one substituent selected from a deuterium atom, halogen atom, alkyl group, sulfide group, thiol group, carboxyl group, amine group, amide group, and alkoxy group. In addition, each substituent may be substituted or unsubstituted. For example, a methylamino group may be interpreted as an amino group. As used herein, the term "or" is not an exclusive term, e.g., "A or B" may refer to A, B, or A and B. As used herein, the "aromatic" group may refer to a carbocyclic group or a heterocyclic group (e.g., a heteroaromatic group).

In this description, a halogen atom may include a fluorine atom, a chlorine atom, a bromine atom, or an iodine atom. In this description, an alkyl group may be a linear, branched, or cyclic alkyl group. An alkyl group may have 1 to 30 carbon atoms.

In this description, an amino group may have 1 to 30 carbon atoms. An amino group may include an alkyl amino group and an aryl amino group. An amino group may include, for example, one or more of a methylamino group, an ethylamino group, a dimethylamino group, diethylamino group, and ethylmethyl amino group.

Unless defined otherwise in this description, when no chemical bond is drawn at a position in chemical formulae, hydrogen may be bonded to the position to which the chemical bond is supposed to be given.

The following will now describe a polishing composition according to an embodiment.

According to an embodiment, the polishing composition may include, e.g., an abrasive, a first additive, a second additive, and a chelating agent. The polishing composition may be used for chemical mechanical polishing (CMP). A polishing-target may include metal, e.g., a phase change metal or material. The phase change material may include, e.g., Te, Po, Sb, In, Ge, Ga, Sn, Ag, or a III-V group material. The phase change material may include a phase change alloy, which phase alloy may include at least two different kinds of phase change materials. For example, the phase change alloy may include $Ge_xSb_yTe_z$ (in which x, y, and z are positive rational numbers). In an implementation, the phase change alloy may include, e.g., InSe, $Sb_2Te_3$, GeTe, $Ge_2Sb_2Te_5$, InSbTe, GaSeTe, $SnSb_2Te_4$, InSbGe, AgInSbTe, (GeSn)SbTe, GeSb(SeTe), or $Te_{81}Ge_{15}Sb_2S_2$. The following will discuss examples in which the polishing target includes the phase change material.

The abrasive may help remove the polishing target in a polishing process. The abrasive may include, e.g., silica or alumina. The silica may include, e.g., fumed silica or colloidal silica. The abrasive may have a diameter of, e.g., about 20 nm to about 120 nm. The abrasive may have a composition ratio of (may be included in the composition in an amount of), e.g., about 0.1 wt % to about 10 wt %. A surface zeta potential of the abrasive may be controlled to adjust polishing rates and dispersibility of the abrasive in the polishing composition. The surface zeta potential of the abrasive may be, e.g., about 10 mV to about 30 mV. For example, the abrasive may exhibit superior dispersibility to uniformly polish the polishing target. In a polishing process, a potential of the abrasive may be opposite to that of a surface of the polishing target. The surface of the polishing target may be exposed to a polishing process. For example, the abrasive may increase a polishing rate of the polishing target.

The chelating agent may provide a chelating ligand in a polishing process. During polishing of the polishing target, residues (e.g., by-products) may be formed. If the residues were to be re-adsorbed on the polishing target, the polishing target could have a reduced degree of planarization or have defects, such as scratches or recesses. The chelating agent may help reduce or prevent the re-adsorption of the residues. For example, the polishing target may have a flat and uniform surface. The chelating agent may help promptly remove the residues of the polishing target. For example, the polishing rate may increase. In this description, unless described otherwise, the phrase "a/the polishing rate increases" may mean that the polishing target is polished at higher rates.

In an implementation, the chelating agent may include, e.g., iminodiacetic acid, nitrilotriacetic acid, ethylenediaminetetraacetic acid, ethylenediaminetetraacetic acid, methylglycinediacetic acid, trans-1,2-diaminocyclohexane-N,N,N',N'-tetraacetic acid, 1,2-diaminopropane-N,N,N,N-tetraacetic acid, ethylene glycol-bis(2-aminoethylether)-N,N,N,N-tetraacetic acid, 2-phosphonobutane-1,2,4-tricarboxylic acid, or N,N-bis(2-hydroxybenzyl)ethylenediamine-N,N-diacetic acid The iminodiacetic acid (referred to hereinafter as IDS) may be represented by Chemical Formula A1 below.

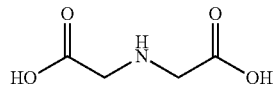

[Chemical Formula A1]

The ethylenediaminetetraacetic acid (referred to hereinafter as EDTA) may be represented by Chemical Formula A2 below.

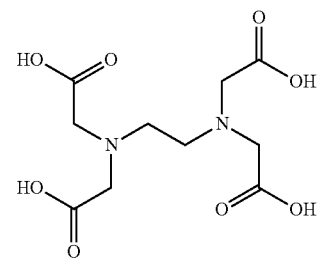

[Chemical Formula A2]

The methylglycinediacetic acid (referred to hereinafter as MGDA) may be represented by Chemical Formula A3 below.

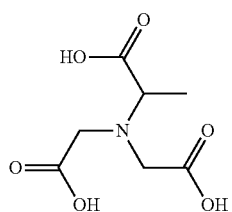

[Chemical Formula A3]

The diethylenetriaminepentaacetic acid (referred to hereinafter as DTPA) may be represented by Chemical Formula A4 below.

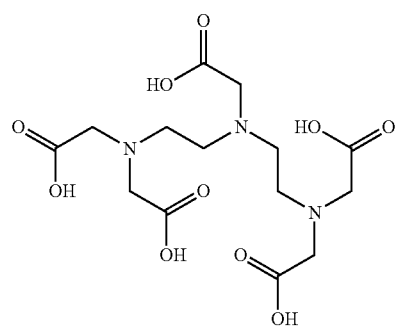

[Chemical Formula A4]

In an implementation, the polishing composition may further include an oxidizing agent. The oxidizing agent may oxidize the polishing target to help increase the polishing rate in a polishing process. The oxidizing agent may include, e.g., a peroxide compound, such as hydrogen peroxide. The oxidizing agent may be included in the composition in an amount of, e.g., about 0.1 wt % to about 5.0 wt %.

The first additive may include a C5 to C30 hydrocarbon (having 5 to 30 carbon atoms) that includes an amide group and a carboxyl group. In an implementation, the first additive may be, e.g., represented by Chemical Formula 1 below.

[Chemical Formula 1]

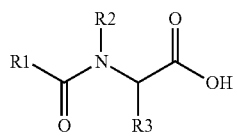

In Chemical Formula 1, R1 may be, e.g., substituted or unsubstituted C5 to C25 alkyl group or a substituted or unsubstituted C5 to C25 aromatic group. R2 and R3 may independently be, e.g., hydrogen, deuterium, a (e.g., unsubstituted) C1 to C3 alkyl group, or a C1 to C3 alkyl group that is substituted with a carboxyl group.

In an implementation, in Chemical Formula 1, the substituted C5 to C25 alkyl group may be a C5 to C25 alkyl that is substituted with an amide group and a carboxyl group.

In an implementation, the compound represented by Chemical Formula 1 may include, e.g., lauroyl iminodiacetic acid (represented by Chemical Formula 2a), N-lauroylglycine (represented by Chemical Formula 2b), N-lauroylalanine (represented by Chemical Formula 2c), N-lauroylethylenediaminetriacetic acid (represented by Chemical Formula 2d), N-lauroyl sarcosine (represented by Chemical Formula 2e), or N-oleoylsarcosine (represented by Chemical Formula 2f).

[Chemical Formula 2a]

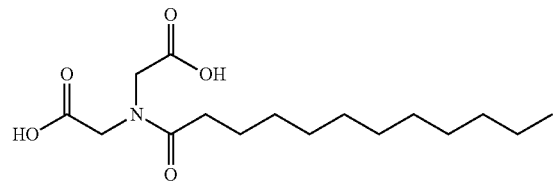

[Chemical Formula 2b]

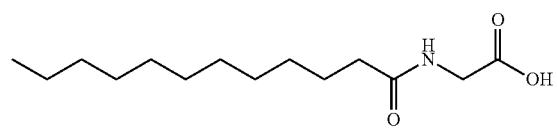

[Chemical Formula 2c]

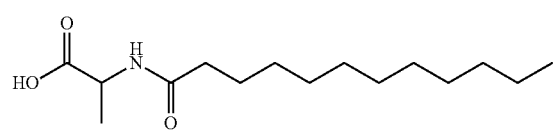

[Chemical Formula 2d]

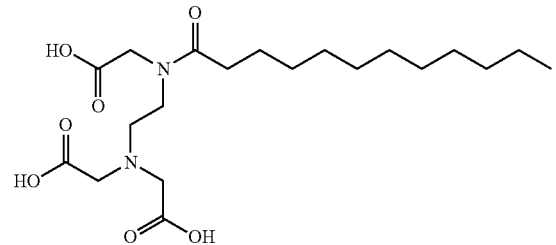

[Chemical Formula 2e]

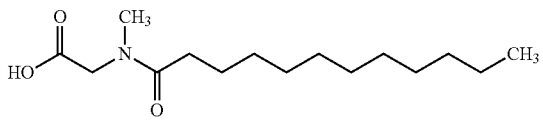

[Chemical Formula 2f]

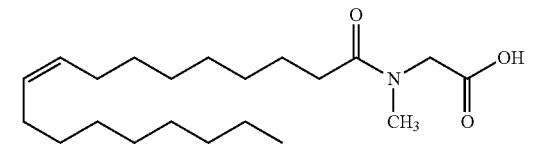

In an implementation, the first additive may be, e.g., a C5 to C30 hydrocarbon that includes two or more amine groups. In an implementation, the first additive may be a C5 to C30 alkyl diamine. The amine may include a primary amine, a secondary amine, or tertiary amine. In an implementation, the first additive may include, e.g., N-lauroylethyenediamine (N-dodecylethylenediamine) (represented by Chemical Formula 3).

[Chemical Formula 3]

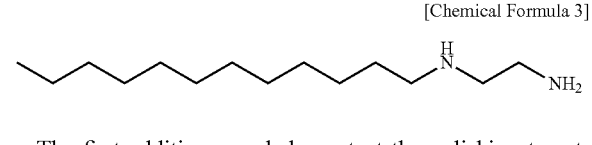

The first additive may help protect the polishing target. The first additive may include an anionic surfactant. The first additive may include a first functional group and a first hydrophobic group. The first hydrophobic group may include the group represented by R1 in Chemical Formula 1. The first functional group may be a hydrophilic group. For example, the first functional group may be anionic. In an implementation, the first functional group may include, e.g., the amide group and the carboxyl group. In an implementation, the first functional group may be, e.g., an amine group.

The first additive may be included in the composition in an amount of about 1 ppm to about 100 ppm (e.g., by mass). Maintaining the amount of the first additive at about 1 ppm or greater may help ensure that the polishing target is sufficiently protected. Maintaining the amount of the first additive at about 100 ppm or less may help prevent aggregation of additives, thereby maintaining the desired polishing rate of the polishing target.

The second additive may include, e.g., a material having a sulfonate group. In an implementation, the second additive may include, e.g., a sulfonic acid, a sulfonate, or a sulfonate salt.

The sulfonic acid may be substituted or unsubstituted. In an implementation, the sulfonic acid may include, e.g., a substituted or unsubstituted alkyl sulfonic acid having 1 to 20 carbon atoms or a substituted or unsubstituted aromatic sulfonic acid having 1 to 20 carbon atoms. In an implementation, the substituted alkyl sulfonic acid may include, e.g., a fluorine-substituted alkyl sulfonic acid having 1 to 20 carbon atoms, an alkyl amido alkyl sulfonic acid having 1 to 20 carbon atoms, an alkyl sulfide alkyl sulfonic acid having 1 to 20 carbon atoms, or a thio alkyl sulfonic acid having 1 to 20 carbon atoms. In an implementation, the substituted aromatic sulfonic acid having 1 to 20 carbon atoms may include, e.g., an alkyl benzene sulfonic acid having 1 to 20 carbon atoms.

In an implementation, the sulfonic acid may include, e.g., methanesulfonic acid, ethanesulfonic acid, propanesulfonic acid, butanesulfonic acid, pentanesulfonic acid, hexanesulfonic acid, benzenesulfonic acid, dodecylbenzenesulfonic acid, p-toluenesulfonic acid, 1-naphthalenesulfonic acid, 2-naphthalenesulfonic acid, trifluoromethanesulfonic acid, 2-acrylamidopropanesulfonic acid, 2-acrylamido-2-methylpropanesulfonic acid, 3-acrylamido-2,4,4-trimethylpentanesulfonic acid, 2-acrylamido-2-(p-tolyl)ethanesulfonic acid, or 2-acrylamido-2-pyridylethanesulfonic acid. In an implementation, the sulfonic acid may include, e.g., 8-hydroxyquinoline-5-sulfonic acid.

The sulfonate may be substituted or unsubstituted. In an implementation, the sulfonate may include, e.g., a substituted or unsubstituted alkyl sulfonate having 1 to 20 carbon atoms or a substituted or unsubstituted aromatic sulfonate having 1 to 20 carbon atoms. In an implementation, the substituted alkyl sulfonate having 1 to 20 carbon atoms may include, e.g., a fluorine-substituted alkyl sulfonate having 1 to 20 carbon atoms, an alkyl amido alkyl sulfonate having 1 to 20 carbon atoms, ab alkyl sulfide alkyl sulfonate having 1 to 20 carbon atoms, or a thio alkyl sulfonate having 1 to 20 carbon atoms.

The sulfonate salt may be substituted or unsubstituted. In an implementation, the sulfonate salt may include, e.g., a substituted or unsubstituted alkyl sulfonate salt having 1 to 20 carbon atoms or a substituted or unsubstituted aromatic sulfonate salt having 1 to 20 carbon atoms. In an implementation, the substituted alkyl sulfonate salt having 1 to 20 carbon atoms may include, e.g., a fluorine-substituted alkyl sulfonate salt having 1 to 20 carbon atoms, analkyl amido alkyl sulfonate salt having 1 to 20 carbon atoms, an alkyl sulfide alkyl sulfonate salt having 1 to 20 carbon atoms, or a thio alkyl sulfonate having 1 to 20 carbon atoms.

In an implementation, the second additive may include, e.g., sodium 3-mercapto-1-propanesulfonate, sodium dodecylbenzenesulfonate, dodecyldimethyl(3-sulfopropyl) ammonium hydroxide, tetrabutylammonium methanesulfonate, 3-(amidinothio)-1-propanesulfonic acid, sodium anthraquinone-2-sulfonate, sodium 2-methyl-2-propene-1-sulfonate, 3-cyclohexylamino-2-hydroxypropanesulfonic acid sodium, hexaethylene glycol di-p-toluenesulfonate, disodium 1,4-butanedisulfonate, disodium 3,3'-dithiobis(1-propanesulfonate), or 2,4-hexadiyne-1,6-diol bis(azobenzene-4-sulfonate).

The second additive may include an anionic surfactant. For example, the second additive may include a second functional group and a second hydrophobic group. The second functional group may be the sulfonate group, the sulfonic acid group, or the sulfonic acid salt that are discussed above. In an implementation, the second hydrophobic group may be, e.g., a substituted or unsubstituted alkyl group. In an implementation, the second hydrophobic group may include, e.g., a substituted or unsubstituted alkyl having 1 to 20 carbon atoms or a substituted or unsubstituted aromatic group having 1 to 20 carbon atoms. In an implementation, the substituted alkyl and the substituted aromatic group may be the same as those discussed above.

A surface of a silicon nitride layer may be positively charged in a polishing process. The sulfonate group, the sulfonic acid group, and the sulfonic acid salt may be rich in electrons. For example, the second functional group of the second additive may be anionic and may interact with the surface of the silicon nitride layer. The interaction between the second functional group of the second additive and the surface of the silicon nitride layer may be a molecular interaction.

The second additive may help protect a non-polishing target against the abrasive. The non-polishing target may include, e.g., a silicon containing dielectric material. The silicon containing dielectric material may include, e.g., silicon oxide, silicon nitride, or silicon oxynitride. The second additive may not interrupt an interaction between the first additive and the non-polishing target. For example, the polishing composition may include the second additive, and the polishing target may be polished at satisfactory rates. In an implementation, the polishing composition may include the second additive, and the phase change material may have an improved polishing selectivity with respect to the silicon containing dielectric material in a polishing process that uses the polishing composition. For example, when the polishing process is performed, a polishing rate of the silicon containing dielectric material may be much lower than a polishing rate of the phase change material.

In an implementation, the second additive may be included in the composition in an amount of about 1 ppm to about 100 ppm. Maintaining the amount of the second additive at about 1 ppm or greater may help ensure that the non-polishing target is sufficiently protected. Maintaining the amount of the second additive at about 100 ppm or greater may help prevent aggregation of the additives, thereby ensuring that the polishing rate of the polishing target may be maintained. For example, when the polishing process is performed using the polishing composition, the non-polishing target may be polished at extremely low rate, and the polishing target may be polished at a much higher rate.

In an implementation, the polishing composition may have a pH of, e.g., about 2.5 to about 4.0. The polishing composition may include, e.g., nitric acid, phosphoric acid, or an organic acid (such as carboxyl acid), with the result that the pH of the polishing composition may be adjusted. In an implementation, the polishing composition may include, e.g., potassium hydroxide or sodium hydroxide, with the result that the pH of the polishing composition may be adjusted.

Water, e.g., deionized water, may be used as a solvent to prepare the polishing composition. The polishing composition may be in a slurry state.

FIG. 1 illustrates a substrate according to some example embodiments.

FIGS. 2, 3, 4, 6, 7, and 8 illustrate stages in a method of fabricating a semiconductor device according to some example embodiments.

Figure 2:
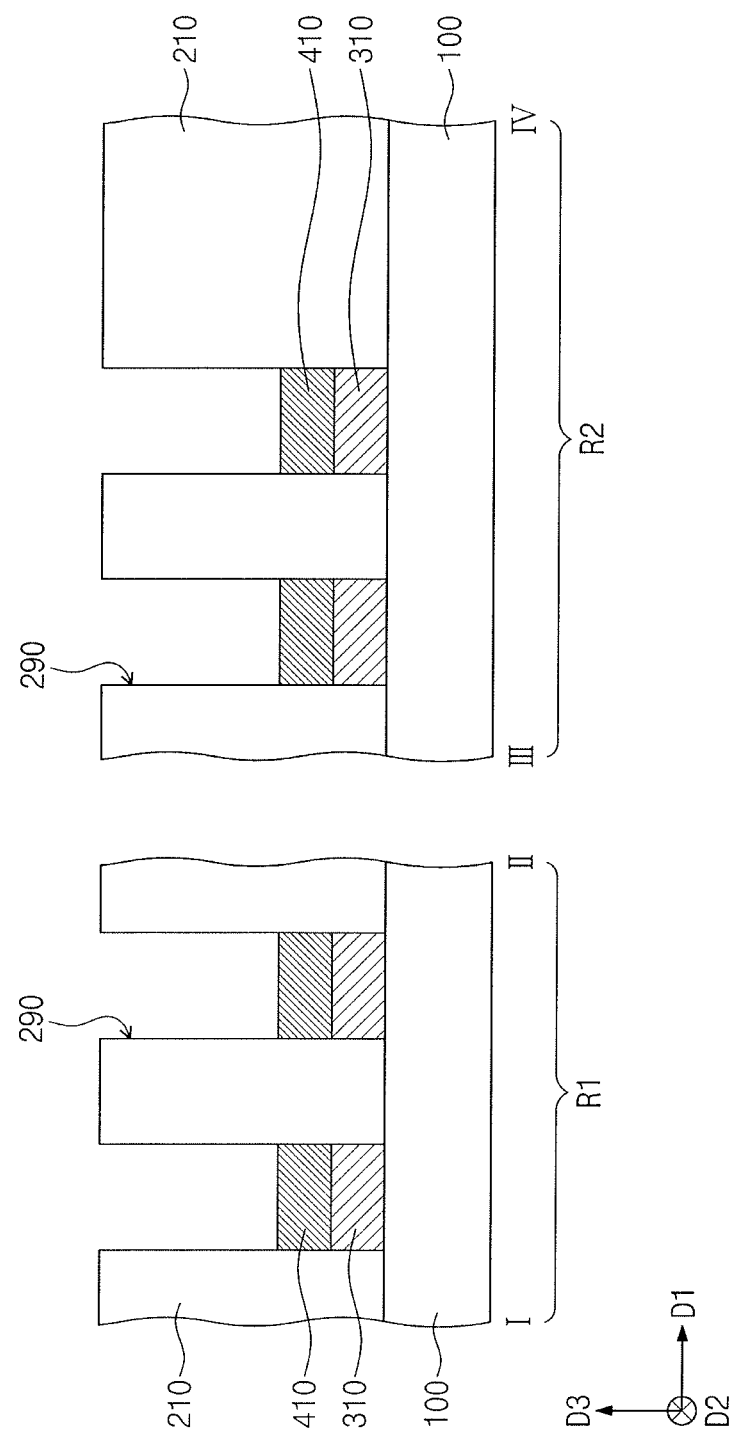
FIGS. 2, 3, 4, 6, 7, and 8 illustrate stages in a method of fabricating a semiconductor device according to some example embodiments.

Referring to FIGS. 1 and 2, a substrate 100 may be prepared. The substrate 100 may include a semiconductor wafer like that shown in FIG. 1. When viewed in plan, the substrate 100 may include a first region R1 and a second region R2. The first region R1 may correspond to a central area of the substrate 100. The second region R2 may correspond to an edge area of the substrate 100.

First conductive lines 310 may be provided on the first and second regions R1 and R2 of the substrate 100. The first conductive lines 310 may be spaced apart from each other in a first direction D1. The first conductive lines 310 may extend parallel to a second direction D2. The first direction D1 may be parallel to a top surface of the substrate 100. The second direction D2 may be parallel to the top surface of the substrate 100 and may intersect the first direction D1. A third direction D3 may intersect the first and second directions D1 and D2. In an implementation, the first conductive lines 310 may include metal (e.g., copper, tungsten, or aluminum) or metal nitride (e.g., tantalum nitride, titanium nitride, or tungsten nitride).

First electrode patterns 410 may be formed on and correspondingly connected to the first conductive lines 310. The first electrode patterns 410 may include a material whose resistivity is greater than those of the first conductive lines 310. The first electrode patterns 410 may include, e.g., W, Ti, Al, Cu, C, CN, TiN, TiAlN, TiSiN, TiCN, WN, CoSiN, WSiN, TaN, TaCN, TaSiN, or TiO.

A first interlayer dielectric layer 210 may be formed on the first and second regions R1 and R2 of the substrate 100. The first interlayer dielectric layer 210 may include a silicon containing dielectric material, and the silicon containing dielectric material may include, e.g., silicon oxide, silicon nitride, or silicon oxynitride. In an implementation, the first interlayer dielectric layer 210 may include, e.g., silicon nitride. The first interlayer dielectric layer 210 may be patterned to form openings 290 therein. The openings 290 may expose corresponding first electrode patterns 410.

Figure 3:
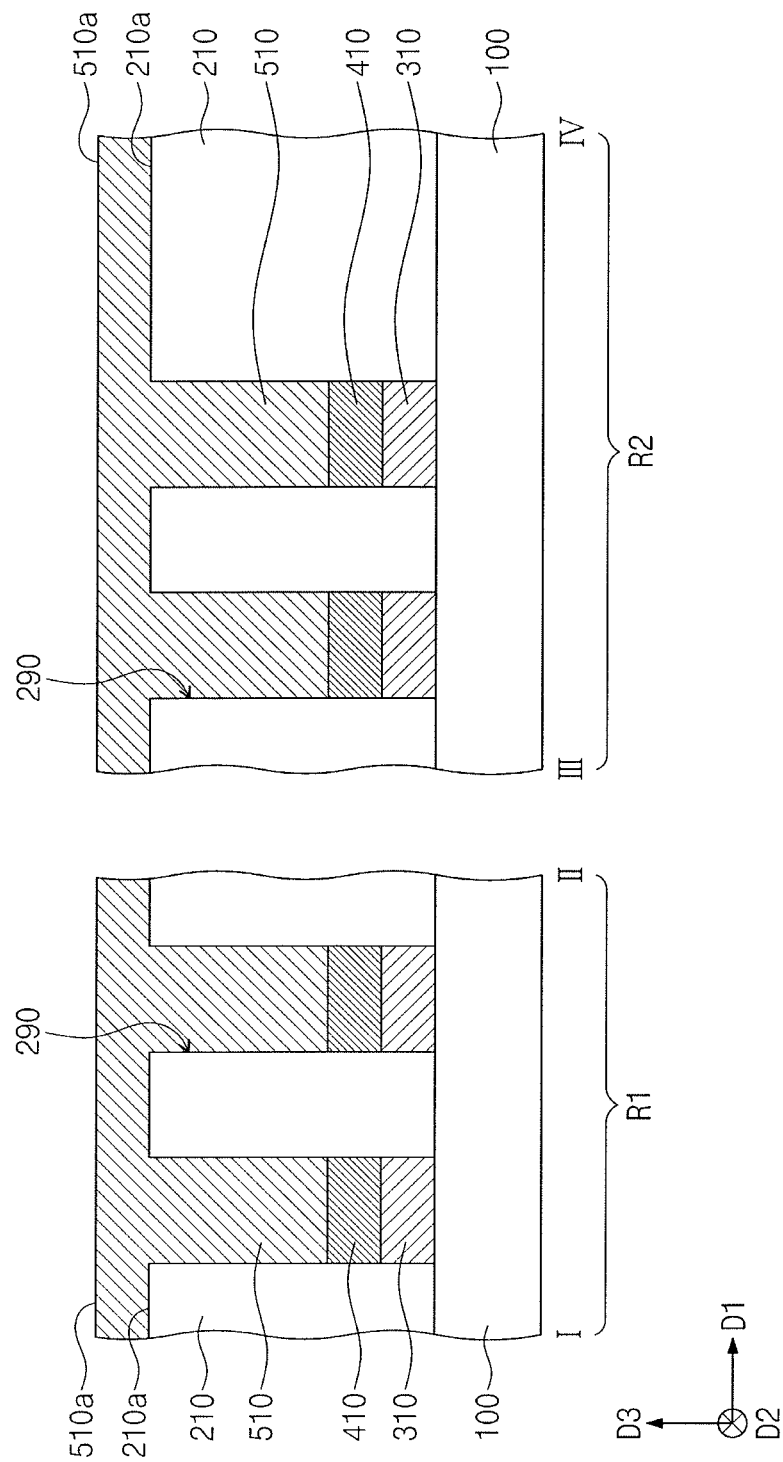

Referring to FIG. 3, a phase change layer 510 may be formed in the openings 290 and on a top surface 210a of the first interlayer dielectric layer 210. For example, the phase change layer 510 may fill the openings 290 on the first and second regions R1 and R2 of the substrate 100 and may cover the top surface 210a of the first interlayer dielectric layer 210. The phase change layer 510 may have a top surface 510a at a higher level (e.g., farther from the substrate 100 in the third direction D3) than that of the top surface 210a of the first interlayer dielectric layer 210. Formation of the phase change layer 510 may be performed by a deposition process. The phase change layer 510 may include a material whose phase is reversibly changed between crystalline and amorphous states based on temperature. The phase change layer 510 may have a phase transition temperature, which induces a phase transition between the crystal and amorphous states, of about 250° C. to about 350° C. The phase change layer 510 may include a compound in which Te or Se (as chalcogen elements) are combined with, e.g., Ge, Sb, Bi, Pb, Sn, Ag, As, S, Si, In, Ti, Ga, P, O, or C. The phase change layer 510 may include the material discussed above in the examples of the phase change material or the phase change alloy. In an implementation, the phase change layer 510 may include Ge, Sb, and Te. In an implementation, the phase change layer 510 may be an alloy represented by $Ge_xSb_yTe_z$ (where, x, y, and z are positive rational numbers).

Figure 4:
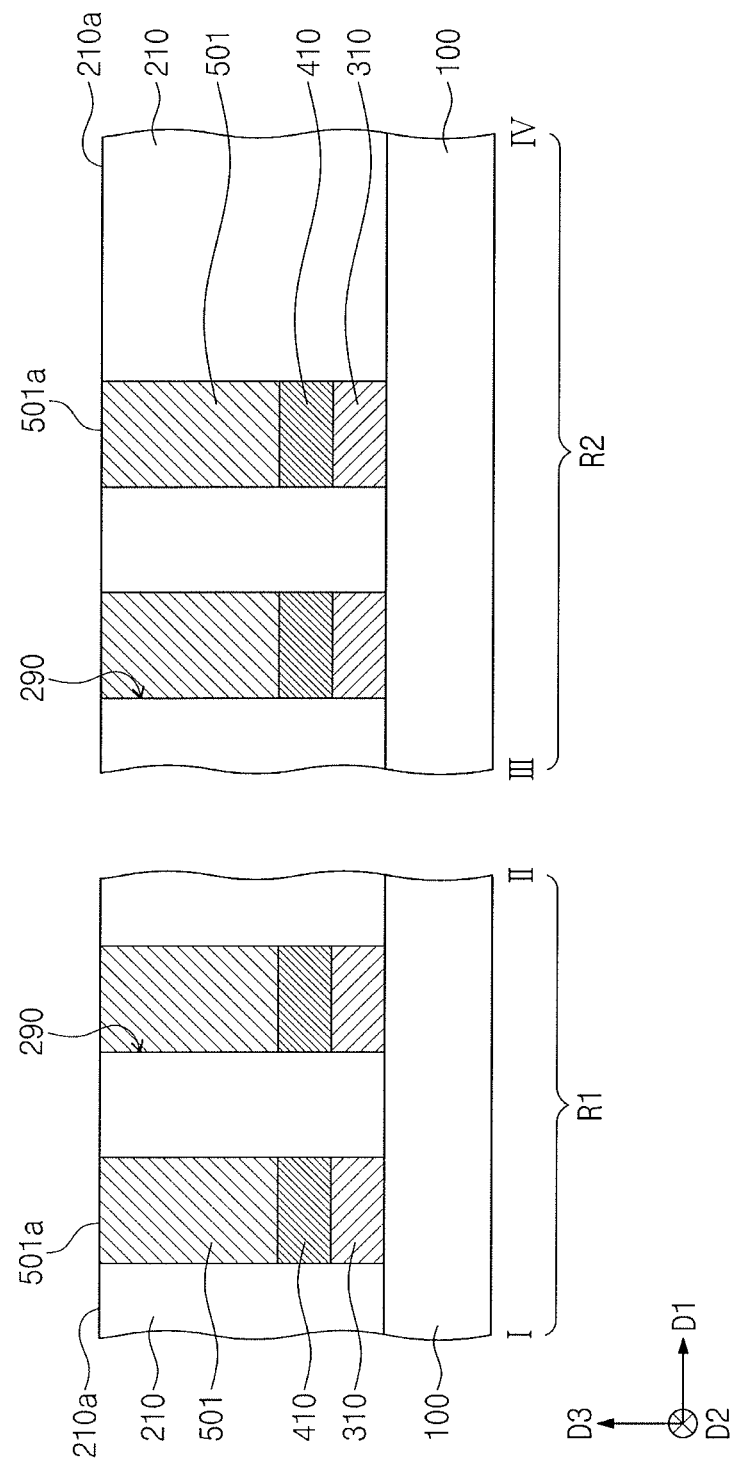

Referring to FIG. 4, the phase change layer 510 may undergo a polishing process to form preliminary phase change patterns 501. The polishing process may include a chemical mechanical polishing process. The polishing process may be performed using the polishing composition discussed above. The polishing process may continue until the top surface 210a of the first interlayer dielectric layer 210 is exposed. The preliminary phase change patterns 501 may be locally formed (e.g., may remain) in corresponding openings 290. As the polishing process is performed, the phase change layer 510 may have a polishing selectivity with respect to the first interlayer dielectric layer 210. The preliminary phase change patterns 501 may have top surfaces 501a coplanar with the top surface 210a of the first interlayer dielectric layer 210. The top surfaces 501a of the preliminary phase change patterns may be at substantially the same level (e.g., same distance from the substrate 100 in the third direction D3) as the top surface 210a of the first interlayer dielectric layer 210. The phase change layer 510 may be uniformly polished to form the preliminary phase change patterns 501. The top surfaces 501a of the preliminary phase change patterns 501 may be located at substantially the same level on the first region R1 of the substrate 100. The top surfaces 501a of the preliminary phase change patterns 501 may be located at substantially the same level on the second region R2 of the substrate 100. The top surfaces 501a of the preliminary phase change patterns 501 on the first region R1 of the substrate 100 may be located at substantially the same level as that of the top surfaces 501a of the preliminary phase change patterns 501 on the second region R2 of the substrate 100.

The following will discuss in detail the polishing process, performed on the phase change layer 510, according to some example embodiments.

Figure 5A:
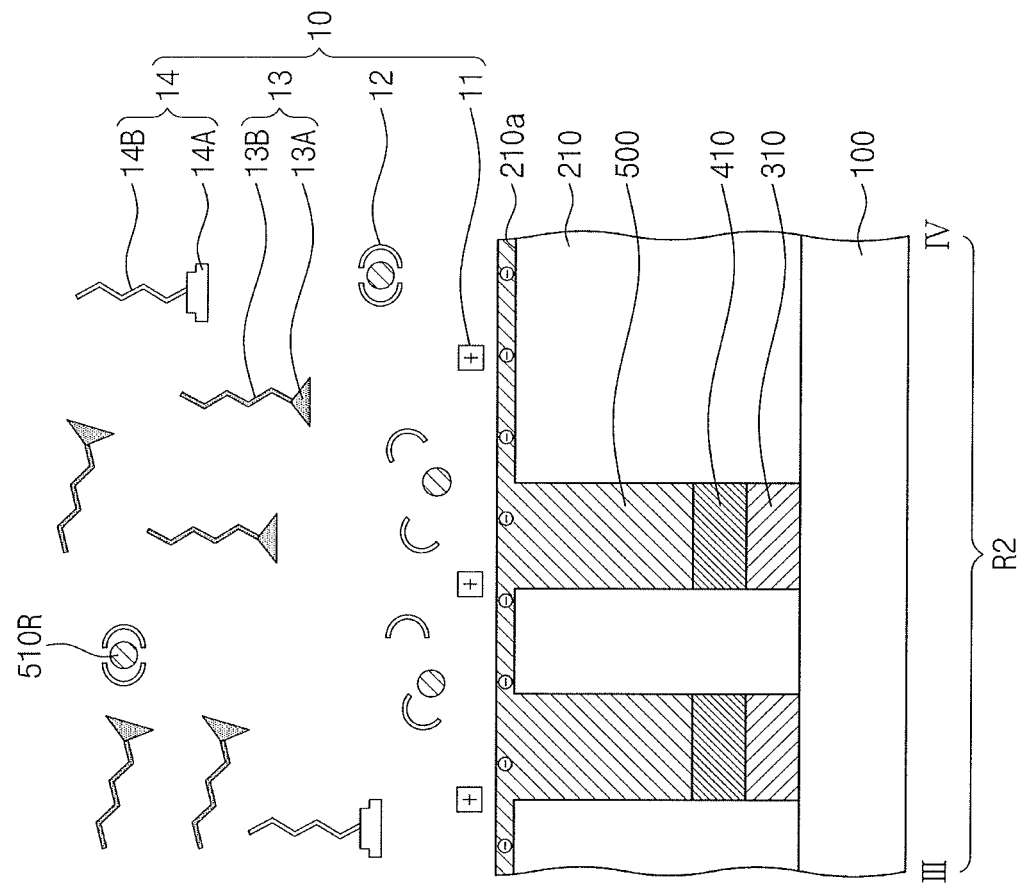

FIGS. 5A and 5B illustrate stages in a polishing process in which a phase change layer is polished with a polishing composition according to some example embodiments. FIGS. 3 and 4 will also be referenced to discuss the following example.

Referring to FIG. 5A, a polishing composition 10 may include, e.g., an abrasive 11, a chelating agent 12, a first additive 13, and a second additive 14. The abrasive 11 may help remove the phase change layer 510. The top surface 510a of the phase change layer 510 may have a negative potential in the polishing process. The abrasive 11 may have a positive potential under a condition of pH 2.5 to pH 4.0. In the polishing process, the abrasive 11 may have a potential opposite to the top surface 510a of the phase change layer 510, and thus may strongly interact with the phase change layer 510. Therefore, the phase change layer 510 may be polished at increased rate.

In an implementation, the abrasive 11 may have a surface zeta potential of, e.g., about 10 mV to about 30 mV. Maintaining the surface potential of the abrasive 11 at about 10 mV or greater may help prevent aggregation of the abrasive 11 in the polishing composition 10, thereby providing good dispersibility. In such a case, the phase change layer 510 may be uniformly polished. Maintaining the surface zeta potential of the abrasive 11 at about 30 mV or less may help ensure that the abrasive 11 is easily removed from the phase change layer 510 after the polishing process. The abrasive 11 may exhibit excellent dispersibility, and accordingly the phase change layer 510 may be uniformly polished.

Maintaining the pH of the polishing composition 10 at about 2.5 or greater may help prevent excessive corrosion of the phase change layer 510 (e.g., in part). Maintaining the pH of the polishing composition 10 at about 4.0 or less may help ensure that the abrasive 11 has an opposite potential to that of the surface of the phase change layer 510. In an implementation, the polishing composition 10 may have a pH of about 2.5 to about 4.0, and the phase change layer 510 may be satisfactorily polished.

The second additive 14 may not interrupt an interaction between the abrasive 11 and the phase change layer 510. For example, when the polishing composition 10 includes even the second additive 14, the phase change layer 510 may be polished at satisfactory rate.

The phase change layer 510 could otherwise be re-adsorbed with phase change residues 510R removed therefrom, and this could reduce the degree of planarization of the top surfaces 501a of the preliminary phase change patterns 501 shown in FIG. 5B that are formed by the polishing process. Alternatively, defects such as scratches and/or recesses could otherwise occur on the top surfaces 501a of the preliminary phase change patterns 501. However, according to an embodiment, as the polishing process is performed, the chelating agent 12 may interact with the phase change residues 510R to help prevent the phase change layer 510 from being re-adsorbed with the phase change residues 510R. For example, the top surfaces 501a of the preliminary phase change patterns 501 may become uniformly flat. The top surfaces 501a of the preliminary phase change patterns 501 may be exposed to the polishing process. The chelating agent 12 may promptly remove the phase change residues 510R. For example, the phase change layer 510 may be polished at increased rate.

In an implementation, the polishing composition 10 may further include an oxidizing agent. The oxidizing agent may oxidize the phase change layer 510, which may result in an increase in polishing rate of the phase change layer 510. The polishing process may include removing the phase change layer 510 from the first interlayer dielectric layer 210.

Referring to FIG. 5B, when the first interlayer dielectric layer 210 is exposed, the second additive 14 may help protect the first interlayer dielectric layer 210 against or from the abrasive 11. The second additive 14 may be an anionic surfactant. For example, the second additive 14 may include a second functional group 14A and a second hydrophobic group 14B. The second functional group 14A may be the sulfonate group, the sulfonic acid group, or the sulfonic acid salt that are discussed above. The second hydrophobic group 14B may be the substituted or unsubstituted alkyl group that is discussed above.

The first interlayer dielectric layer 210 may include a silicon nitride layer. When the first interlayer dielectric layer 210 is exposed to the polishing composition 10, the first interlayer dielectric layer 210 may have a positive charge on the top surface 210a thereof. The sulfonate group, the sulfonic acid group, or the sulfonic acid salt of the second additive 14 may be rich in electrons. For example, the second functional group 14A of the second additive 14 may have a negative charge and may interact with the top surface 210a of the first interlayer dielectric layer 210. The interaction may be a molecular interaction. The interaction may cause the second additive 14 to protect the first interlayer dielectric layer 210.

An undesirable recess could otherwise be formed on the first interlayer dielectric layer 210 on the second region R2 of the substrate 100. For example, the top surface 210a of the first interlayer dielectric layer 210 on the second region R2 could otherwise be located at a lower level than that of the top surface 210a of the first interlayer dielectric layer 210 on the first region R1. However, according to an embodiment, the second additive 14 may protect the top surface 210a of the first interlayer dielectric layer 210, and the top surface 210a of the first interlayer dielectric layer 210 may become flat after the polishing process. For example, the top surfaces 210a of the first interlayer dielectric layer 210 on the second region R2 of the substrate 100 may be located at substantially the same level as that of the top surfaces 210a of the first interlayer dielectric layer 210 on the first region R1 of the substrate 100.

The pH of the polishing composition 10 may be about 2.5 to about 4.0, and the abrasive 11 may have a positive charge in the polishing process. The first interlayer dielectric layer 210 may have a positive charge on the top surface 210a thereof, and a repulsive force may be generated between the first interlayer dielectric layer 210 and the abrasive 11. For example, the abrasive 11 may have difficulty in polishing the top surface 210a of the first interlayer dielectric layer 210. In an implementation, the polishing process using the polishing composition 10 may facilitate an increased polishing selectivity between the phase change layer 510 and the first interlayer dielectric layer 210. For example, the phase change layer 510 may be polished at higher rate, and the first interlayer dielectric layer 210 may be polished at relatively lower rate. For example, the polishing rate may be higher for the phase change layer 510 than for the first interlayer dielectric layer 210.

The first additive 13 may help protect the preliminary phase change patterns 501. The first additive 13 may include a first functional group 13A and a first hydrophobic group 13B. The first hydrophobic group 13B may be one of the groups represented by R1 in Chemical Formula 1. The first functional group 13A may be a hydrophilic group. For example, the first functional group 13A may be anionic. An interaction may be created between the first functional group 13A of the first additive 13 and the top surfaces 501a of the preliminary phase change patterns 501. The interaction may be a molecular interaction, e.g., a hydrogen bond. The interaction may cause the first additive 13 to protect the preliminary phase change patterns 501.

After the first interlayer dielectric layer 210 is exposed, the polishing process may be terminated. The termination of the polishing process may include stopping an operation of a polishing apparatus and performing a cleaning process to remove the polishing composition 10 from the first interlayer dielectric layer 210 and the preliminary phase change patterns 501. The preliminary phase change patterns 501 may further be partially removed by the polishing composition 10 that remain until the cleaning process is completed after the operation of the polishing apparatus is stopped. In this case, the top surfaces 501a of the preliminary phase change patterns 501 may be located at different levels from each other. In an implementation, until the cleaning process is completed, the first additive 13 may protect the top surfaces 501a of the preliminary phase change patterns 501. For example, the top surfaces 501a of the preliminary phase change patterns 501 may be at substantially the same level as that of the top surface 210a of the first interlayer dielectric layer 210. The first additive 13 may help prevent the preliminary phase change patterns 501 from being partially removed, and the top surfaces 501a of the preliminary phase change patterns 501 may be located at substantially the same level.

Figure 6:
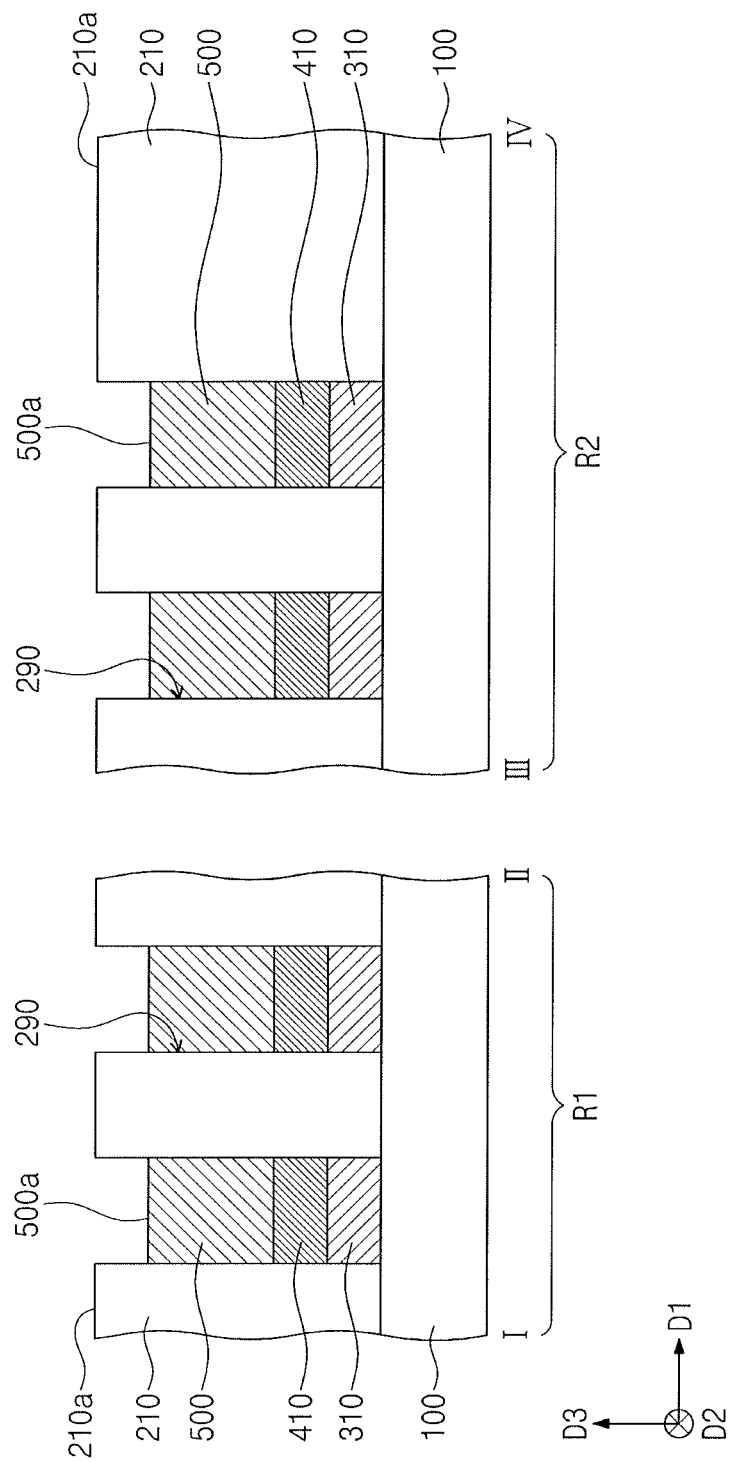

Referring to FIG. 6, the top surfaces 501a of the preliminary phase change patterns 501 may be recessed to form phase change patterns 500. An etching process or an etch-back process may be performed to recess the preliminary phase change patterns 501. The phase change patterns 500 may not fill upper portions of the openings 290. The phase change patterns 500 may expose, e.g., upper lateral surfaces of the openings 290. The top surfaces 500a of the phase change patterns 500 may be located at a lower level than that of the top surface 210a of the first interlayer dielectric layer 210. In an implementation, the top surfaces 501a of the preliminary phase change patterns 501 may be located at the same level, as shown in FIGS. 4 and 5B, and the phase change patterns 500 may have their top surfaces 500a at substantially the same level. For example, the top surfaces 500a of the phase change patterns 500 may be located at substantially the same level on the first region R1 of the substrate 100. The top surfaces 500a of the phase change patterns 500 may be located at substantially the same level on the second region R2 of the substrate 100. The top surfaces 500a of the phase change patterns 500 on the second region R2 of the substrate 100 may be located at substantially the same level as that of the top surfaces 500a of the phase change patterns 500 on the first region R1 of the substrate 100. Accordingly, the phase change patterns 500 may have substantially the same volume.

Figure 7:
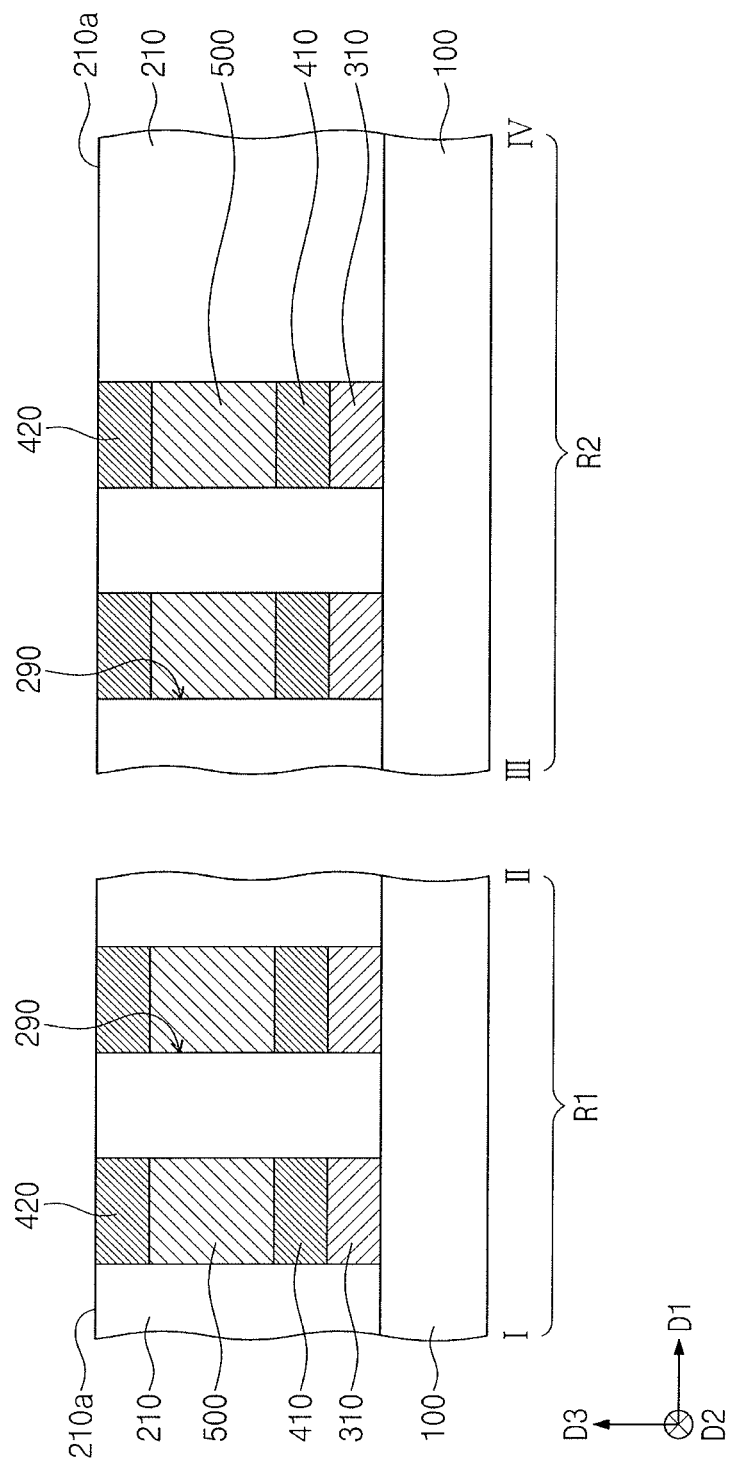

Referring to FIG. 7, second electrode patterns 420 may be formed in corresponding openings 290. The second electrode patterns 420 may be provided on and electrically connected to corresponding phase change patterns 500. The second electrode patterns 420 may include, e.g., W, Ti, Al, Cu, C, CN, TiN, TiAlN, TiSiN, TiCN, WN, CoSiN, WSiN, TaN, TaCN, or TaSiN.

Figure 8:
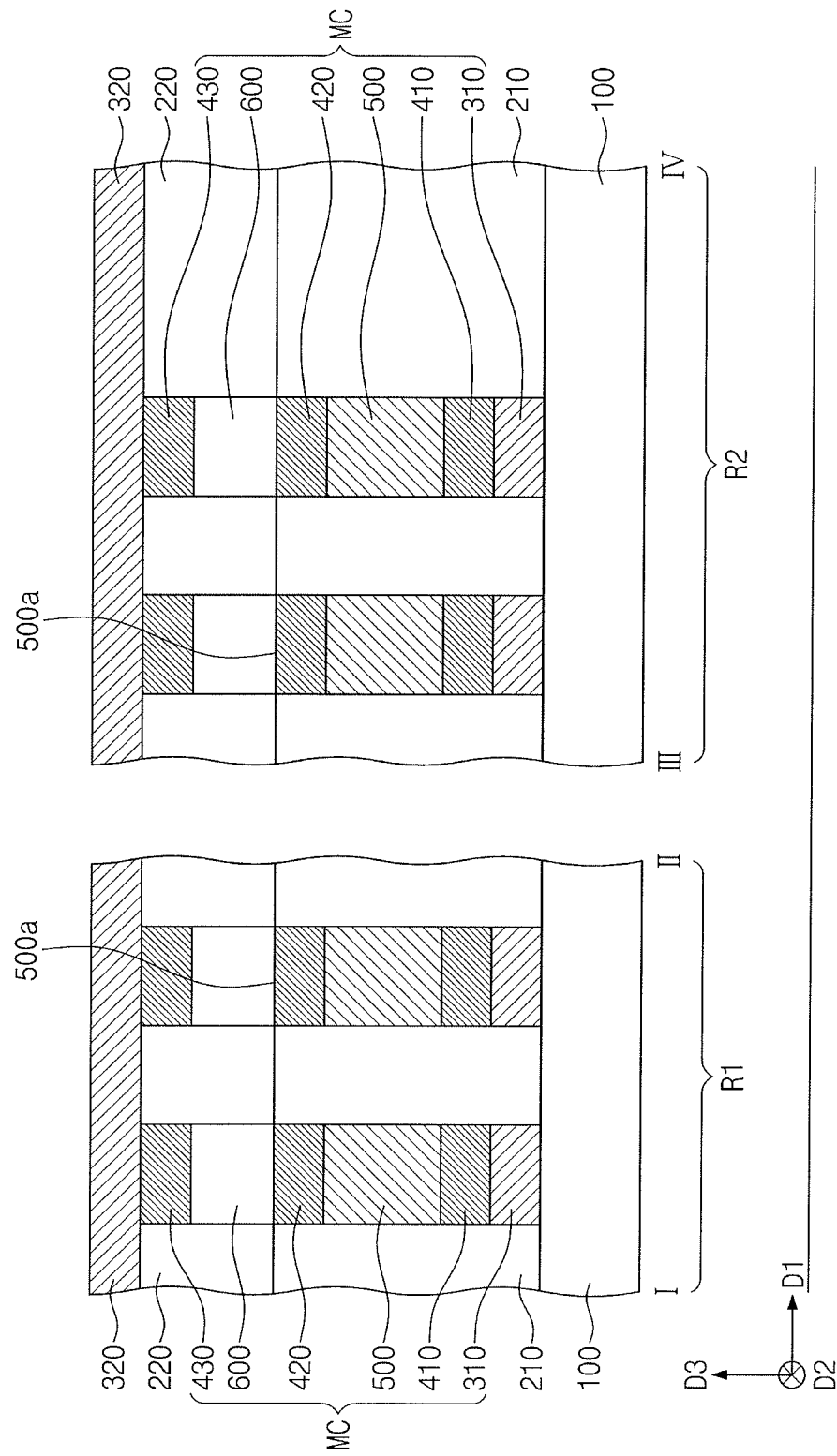

Referring to FIG. 8, switching elements 600 may be formed on corresponding second electrode patterns 420. Third electrode patterns 430 may be formed on corresponding switching elements 600. For example, the formation of the switching elements 600 and the third electrode patterns 430 may include forming a switching layer and an electrode layer on the first interlayer dielectric layer 210 and patterning the switching layer and the electrode layer. A second interlayer dielectric layer 220 may be formed on the first interlayer dielectric layer 210, covering the switching elements 600 and the third electrode patterns 430.

In an implementation, the formation of the switching elements 600 and the third electrode patterns 430 may include forming on the first interlayer dielectric layer 210 the second interlayer dielectric layer 220 having holes that expose corresponding second electrode patterns 420, forming a switching layer filling the holes, etching the switching layer to form the switching elements 600 partially filling corresponding holes, forming on the second interlayer dielectric layer 220 an electrode layer filling the holes, and performing a planarization process until the second interlayer dielectric layer 220 is revealed.

Each of the switching elements 600 may be a device based on threshold switching having a nonlinear I-V curve (e.g., S-type I-V curve). For example, each of the switching elements 600 may be an Ovonic threshold switch (OTS) device having bidirectional characteristics. The switching elements 600 may be associated with a phase transition temperature between crystalline and amorphous states that is greater than a phase transition temperature associate with the phase change patterns 500. For example, the switching elements 600 may have a phase transition temperature of about 350° C. to about 450° C.

The switching elements 600 may include a chalcogenide material and an impurity. The chalcogenide material may include, e.g., a compound in which Te or Se (as chalcogen elements) are combined with Ge, Sb, Bi, Al, Pb, Sn, Ag, As, S, Si, In, Ti, Ga, or P. In an implementation, the chalcogenide material may include, e.g., AsTe, AsSe, GeTe, SnTe, GeSe, SnTe, SnSe, ZnTe, AsTeSe, AsTeGe, AsSeGe, AsTeGeSe, AsSeGeSi, AsTeGeSi, AsTeGeS, AsTeGeSiIn, AsTeGeSiP, AsTeGeSiSbS, AsTeGeSiSbP, AsTeGeSeSb, AsTeGeSeSi, SeTeGeSi, GeSbTeSe, GeBiTeSe, GeAsSbSe, GeAsBiTe, or GeAsBiSe. The impurity may include, e.g., C, N, B, or O.

A second conductive line 320 may be formed on the first interlayer dielectric layer 210 and the second electrode patterns 420, thereby being electrically connected to the second electrode patterns 420. In an implementation, the second conductive line 320 may include a metal (e.g., copper, tungsten, or aluminum) or a metal nitride (e.g., tantalum nitride, titanium nitride, or tungsten nitride). The second conductive line 320 may extend parallel to the first direction D1. In an implementation, the second conductive line 320 may be provided in plural, and the plurality of second conductive lines 320 may be spaced apart from each other in the second direction D2.

Memory cells MC may be correspondingly defined at intersections between the first conductive lines 310 and the second conductive lines 320. Each of the memory cells MC may include the first electrode pattern 410, the phase change pattern 500, the second electrode pattern 420, the switching element 600, and the third electrode pattern 430 that are provided between a corresponding first conductive line 310 and a corresponding second conductive line 320. Through the processes discussed above, a semiconductor device may be eventually fabricated.

The semiconductor device may be a variable resistance memory device. The semiconductor device may store data based on whether the phase change pattern 500 is in a crystalline state or in an amorphous state. A volume of the phase change pattern 500 may influence a reversible phase change between crystalline and amorphous states. In an implementation, the top surfaces 500a of the phase change patterns 500 may be located at substantially the same level, and the phase change patterns 500 may have substantially the same volume. As a result, the semiconductor device may increase in reliability.

The following will explain the polishing composition and the polishing process using the same with reference to Examples and Comparative Examples.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

In the following evaluation of the Examples and Comparative Examples, AP-300™ is a commercially polishing apparatus available from CTS Corporation. IC1010™ is a polishing pad commercially from The Dow Chemical Company. A polishing process was performed under a polishing pressure of 2 psi at 93 rpm. A blanket wafer with a diameter of 12 inches was used in the polishing process.

A polishing rate of a certain layer may mean a removal rate of the certain layer in a chemical mechanical polishing process that uses a polishing apparatus, a polishing pad, and a polishing composition.

The removal rate of the certain layer may indicate a measured value when the polishing composition is used without the polishing apparatus or the polishing pad. For example, the removal rate of the certain layer may be a removal rate of the certain layer when a chemical polishing process is performed without mechanical polishing.

1. Preparation A of Polishing Composition

Preparation of Comparative Example A1

0.5 wt % of a colloidal silica abrasive and 0.5 wt % of a hydrogen peroxide oxidizing agent were added to and mixed in water. Acid (e.g., a pH adjuster) was added until the pH reached 2.5 to form a polishing composition. The polishing composition was prepared in the form of slurry.

Preparation of Comparative Example A2

1.0 wt % of a colloidal silica abrasive and 1.0 wt % of a hydrogen peroxide oxidizing agent were added to and mixed in water to form a polishing composition. Acid was added until the pH reached 2.5 to form a polishing composition. The polishing composition was prepared in the form of slurry.

Preparation of Examples A1 to A11

0.5 wt % of a colloidal silica abrasive and 0.5 wt % of a hydrogen peroxide oxidizing agent were added to and mixed in water. Then, a first additive, a second additive, or a chelating agent, as shown in Table 1, below, were added thereto. Acid was added until the pH reached 2.5 to form a polishing composition. The polishing composition was prepared in the form of slurry.

Table 1 shows Comparative Example A1, Comparative Example A2, and Examples A1 to A11 in terms of their first additive, second additive, chelating agent, and compositional ratio.

measure a removal rate of the Ge layer. At this time, the Ge layer did not undergo mechanical polishing using a polishing apparatus and a polishing pad. The removal rate of the Ge layer was measured by using each of the polishing compositions individually prepared according to Example A1, Example A2, Example A6, Example A7, Example A10, Example A11, Comparative Example A 1, and Comparative Example A2. The removal rate was measured for each of the polishing compositions at 25° C., 45° C., and 80° C.

TABLE 1

|  | Chelating Agent | First Additive | Second Additive | Compositional Ratio (ppm) |
|---|---|---|---|---|
| Comparative Example A1 | — | — | — | — |
| Comparative Example A2 | — | — | — | — |
| Example A1 | EDTA | — | — | 30 |
| Example A2 | DTPA | — | — | 30 |
| Example A3 | IDS | — | — | 30 |
| Example A4 | MGDA | — | — | 30 |
| Example A5 | — | — | 1-heptanesulfonate | 50 |
| Example A6 | — | — | 1-pentanesulfonic acid | 50 |
| Example A7 | — | — | dodecylbenzenesulfonic acid | 50 |
| Example A8 | — | — | 8-hydroxyquinoline-5-sulfonic acid | 50 |
| Example A9 | — | — | p-toluenesulfonic acid | 50 |
| Example A10 | — | N-lauroylsarcosine | — | 50 |
| Example A11 | — | N-oleoylsarcosine | — | 50 |

2. Evaluation A of Polishing Composition
1) Polishing of Phase Change Layer

A phase change layer was deposited to a thickness of 1,000 Å on a wafer. The phase change layer was formed of an alloy of GeSbTe. The wafer was loaded on a polishing apparatus. A polishing process was performed such that a polishing pad and a polishing composition were used to polish the phase change layer. The phase change layer was polished with each of the polishing compositions individually prepared according to Examples A1 to A 11 and Comparative Example A 1 shown in Table 1. A polishing rate of the phase change layer was measured in the polishing process.

2) Polishing of Silicon Nitride Layer

A silicon nitride layer ($Si_3N_4$) was deposited to a thickness of 1,000 Å on a wafer. The silicon nitride layer was polished under the same process condition as that under which the phase change layer was polished. The silicon nitride layer was polished with each of the polishing compositions individually prepared according to Examples A1 to A11 and Comparative Example A 1.

3) Removal Rate of Phase Change Layer at High Temperature

A phase change layer was deposited to a thickness of 1,000 Å on a wafer. The phase change layer was formed of an alloy of GeSbTe. A polishing composition was applied to the phase change layer at 90° C. to measure a removal rate of the phase change layer. At this time, the phase change layer did not undergo mechanical polishing using a polishing apparatus and a polishing pad. The removal rate of the phase change layer was measured by using each of the polishing compositions individually prepared according to Examples A1 to A11 and Comparative Example A1.

4) Removal Rate of Phase Change Layer at Low Temperature

A germanium layer (referred to hereinafter as the Ge layer) was deposited to a thickness of 1,000 Å on a wafer. A polishing composition was applied to the Ge layer to In the same way for the Ge layer, an antimony layer (referred to hereinafter as the Sb layer) was deposited, and a polishing composition was used to measure a removal rate of the Sb layer. The removal rate was measured for each of the polishing compositions at 25° C., 45° C., and 80° C.

In the same way for the Ge layer, a tellurium layer (referred to hereinafter as the Te layer) was deposited, and a polishing composition was used to measure a removal rate of the Te layer. The removal rate was measured for each of the polishing compositions at 25° C., 45° C., and 80° C.

Table 2 shows polishing rates of the phase change layer, polishing rates of the silicon nitride layer, and removal rates of the phase change layer, which polishing and removal rates were measured at 25° C., when using the polishing compositions individually prepared according to Examples A1 to A11 and Comparative Example A1.

TABLE 2

|  | Polishing rate of phase change (GST) layer (Å/min) | Polishing rate of silicon nitride ($Si_3N_4$) layer (Å/min) | Removal rate of phase change (GST) layer (Å/min) |
|---|---|---|---|
| Comparative Example A1 | 202 | 22 | 32 |
| Example A1 | 220 | 8 | 27 |
| Example A2 | 201 | 15 | 8 |
| Example A3 | 167 | 8 | 7 |
| Example A4 | 193 | 15 | 8 |
| Example A5 | 152 | 12 | 8 |
| Example A6 | 307 | 8 | 9 |
| Example A7 | 87 | 5 | 5 |
| Example A8 | 184 | 10 | 9 |
| Example A9 | 75 | 10 | 8 |
| Example A10 | 287 | 4 | 9 |
| Example A11 | 234 | 7 | 10 |

Referring to Table 2, the polishing rate of the silicon nitride layer was lower for Examples A1 to A11 than for Comparative Example A1. The silicon nitride layer may be a non-polishing target layer. It may be found that the polishing rate of the phase change layer, the polishing rate of the silicon nitride layer, and the removal rate of the phase change layer may be controlled based on whether the chelating agent, the first additive, and the second additive are included in the polishing composition. A polishing selectivity of the phase change layer with respect to the silicon nitride layer may be controlled in accordance with the presence and content of the chelating agent, the first additive, and the second additive.

Table 3 shows removal rates of the germanium (Ge) layer, the antimony (Sb) layer, and the tellurium (Te) layer, which removal rates were measured at 25° C., when using the polishing compositions individually prepared according to Example A1, Example A2, Example A6, Example A7, Example A10, Example A11, Comparative Example A1, and Comparative Example A2.

TABLE 3

|  | Constituent | Removal rate of Ge layer (Å/min) | Removal rate of Sb layer (Å/min) | Removal rate of Te layer (Å/min) |
|---|---|---|---|---|
| Comparative Example A1 | — | 8 | 21 | 26 |
| Comparative Example A2 | — | 12 | 41 | 36 |
| Example A1 | EDTA | 1 | 55 | 27 |
| Example A2 | DTPA | 1 | 12 | 33 |
| Example A6 | 1-pentanesulfonic acid | 18 | 10 | 11 |
| Example A7 | dodecylbenzene-sulfonic acid | 1 | 7 | 17 |
| Example A10 | N-lauroylsarcosine | 10 | 4 | 5 |
| Example A11 | N-oleoylsarcosine | 3 | 2 | 10 |

Table 4 shows removal rates of the germanium (Ge) layer, the antimony (Sb) layer, and the tellurium (Te) layer, which removal rates were measured at 45° C., when using the polishing compositions individually prepared according to Example A1, Example A2, Example A6, Example A7, Example A10, Example A 11, Comparative Example A1, and Comparative Example A2.

TABLE 4

|  | Constituent | Removal rate of Ge layer (Å/min) | Removal rate of Sb layer (Å/min) | Removal rate of Te layer (Å/min) |
|---|---|---|---|---|
| Comparative Example A1 | — | 9 | 47 | 26 |
| Comparative Example A2 | — | 20 | 62 | 59 |
| Example A1 | EDTA | 5 | 94 | 57 |
| Example A2 | DTPA | 1 | 48 | 61 |

TABLE 4-continued

|  | Constituent | Removal rate of Ge layer (Å/min) | Removal rate of Sb layer (Å/min) | Removal rate of Te layer (Å/min) |
|---|---|---|---|---|
| Example A6 | 1-pentanesulfonic acid | 54 | 28 | 34 |
| Example A7 | dodecylbenzene-sulfonic acid | 18 | 17 | 65 |
| Example A10 | N-lauroylsarcosine | 34 | 16 | 36 |
| Example A11 | N-oleoylsarcosine | 25 | 24 | 15 |

Referring to Tables 3 and 4, the removal rates of the germanium (Ge) layer, the antimony (Sb) layer, and the tellurium (Te) layer were different based on whether the chelating agent, the first additive, and the second additive were included in the polishing composition. The phase change layer may include one or more of Ge, Sb, and Te. Kinds and amounts of the chelating agent, the first additive, and the second additive may be controlled in accordance with kinds and amounts of phase change materials contained in the phase change layer. Accordingly, a polishing rate of the phase change layer may increase, and the phase change layer may be uniformly polished.

3. Preparation B of Polishing Composition

Preparation of Comparative Example B1

As shown in Table 5 below, 0.5 wt % of a colloidal silica abrasive, 0.5 wt % of a hydrogen peroxide oxidizing agent, and a chelating agent were added to and mixed in water. Acid was added until the pH reached 2.5 to form a polishing composition. The polishing composition was prepared in the form of slurry.

Preparation of Comparative Examples B2, C1, C2, and C3

0.5 wt % of a colloidal silica abrasive and 0.5 wt % of a hydrogen peroxide oxidizing agent were added to and mixed in water. One or more of a first additive, a second additive, and a chelating agent, were further added, as shown in Table 5 below. Acid was added until the pH reached 2.5 to form a polishing composition.

Preparation of Example B 0.5 wt % of a colloidal silica abrasive and 0.5 wt % of a hydrogen peroxide oxidizing agent were added to and mixed in water. A first additive, a second additive, or a chelating agent, were further added, as shown in Table 5 below. An acid was added until the pH reached 2.5 to form a polishing composition.

Table 5 shows constituents and compositional ratios of the polishing compositions individually prepared according to Comparative Example B1, Comparative Example B2, Comparative Example C1, Comparative Example C2, Comparative Example C3, and Example B.

TABLE 5

|  |  | Compositional Ratio | | | | | |
|---|---|---|---|---|---|---|---|
|  |  | Comparative Example B1 | Comparative Example B2 | Comparative Example C1 | Comparative Example C2 | Comparative Example C3 | Example B |
| Abrasive | Colloidal Additive | 0.5 wt % | 0.5 wt % | 0.5 wt % | 0.5 wt % | 0.5 wt % | 0.5 wt % |
| Oxidizing Agent | $H_2O_2$ | 0.5 wt % | 0.5 wt % | 0.5 wt % | 0.5 wt % | 0.5 wt % | 0.5 wt % |
| Chelating Agent | EDTA | 30 ppm | 30 ppm | 30 ppm | 30 ppm | 30 ppm | 30 ppm |
|  | DTPA | 30 ppm | 30 ppm | 30 ppm | 30 ppm | 30 ppm | 30 ppm |

TABLE 5-continued

| | | Compositional Ratio | | | | | |
|---|---|---|---|---|---|---|---|
| | | Comparative Example B1 | Comparative Example B2 | Comparative Example C1 | Comparative Example C2 | Comparative Example C3 | Example B |
| First Additive | N-lauroyl sarcosine | | | | | 130 ppm | 50 ppm |
| Second Additive | 1-pentane-sulfonic acid | | 50 ppm | 130 ppm | 130 ppm | 130 ppm | 50 ppm |

4. Evaluation B of Polishing Composition

1) Polishing of Phase Change Layer

GeSbTe was deposited to a thickness of 1,000 Å on a wafer, which result in the formation of a GST layer, or a phase change layer. The wafer was loaded on a polishing apparatus. A polishing pad and a polishing composition were used to polish the phase change layer. A polishing rate of the phase change layer was measured by using each of the polishing compositions individually prepared according to Comparative Example B1, Comparative Example B2, and Example B.

2) Polishing of Silicon Nitride Layer

A silicon nitride layer ($Si_3N_4$) was deposited to a thickness of 1,000 Å on a wafer with a radius of 12 inches. The silicon nitride layer was polished under the same process condition as that under which the phase change layer was polished. A polishing rate of the silicon nitride layer was measured by using each of the polishing compositions individually prepared according to Comparative Example B 1, Comparative Example B2, and Example B.

3) Removal Rate of Phase Change Layer at High Temperature

GeSbTe was deposited to a thickness of 1,000 Å on a wafer, to form a phase change layer. The polishing composition was applied to the phase change layer at 80° C. to measure a removal rate of the phase change layer. At this time, the phase change layer did not undergo mechanical polishing using a polishing apparatus and a polishing pad. The removal rate of the phase change layer was measured by using each of the polishing compositions individually prepared according to Comparative Example B1, Comparative Example B2, and Example B.

4) Removal Rate of Phase Change Layer at Low Temperature

A germanium layer (referred to hereinafter as the Ge layer) was deposited to a thickness of 1,000 Å on a wafer. The polishing composition was applied to the Ge layer to measure a removal rate of the Ge layer. At this time, the Ge layer did not undergo mechanical polishing using a polishing apparatus and a polishing pad. The removal rate of the Ge layer was measured by using each of the polishing compositions individually prepared according to Comparative Example B1, Comparative Example B2, and Example B. The removal rate was measured for each of the polishing compositions at 25° C., 45° C., and 80° C.

In the same way for the Ge layer, an antimony layer (referred to hereinafter as the Sb layer) was deposited, and a polishing composition was used to measure a removal rate of the Sb layer. The removal rate was measured for each of the polishing compositions at 25° C., 40° C., and 80° C.

In the same way for the Ge layer, a tellurium layer (referred to hereinafter as the Te layer) was deposited, and a polishing composition was used to measure a removal rate of the Te layer. The removal rate was measured for each of the polishing compositions at 25° C., 45° C., and 80° C.

5) Removal Rate of Phase Change Layer at High Temperature

A phase change layer was deposited to a thickness of 1,000 Å on a blanket wafer. The phase change layer was formed of an alloy of GeSbTe. The polishing composition was applied to the phase change layer at 80° C. to measure a removal rate of the phase change layer. At this time, the phase change layer did not undergo mechanical polishing using a polishing apparatus and a polishing pad. The removal rate of the phase change layer was measured by using each of the polishing compositions individually prepared according to Comparative Example B1, Comparative Example B2, and Example B.

Table 6 shows measured results of polishing rates of the phase change layer (GST), polishing rates of the silicon nitride ($Si_3N_4$) layer, and removal rates of the phase change layer (GST) when using the polishing compositions prepared individually according to Comparative Example B1, Comparative Example B2, and Example B.

TABLE 6

| | Polishing rate of phase change (GST) layer (Å/min) | Polishing rate of silicon nitride ($Si_3N_4$) layer (Å/min) | Removal rate of phase change (GST) layer (Å/min) |
|---|---|---|---|
| Comparative Example B1 | 293 | 30 | 10 |
| Comparative Example B2 | 235 | 12 | 11 |
| Example B | 294 | 9 | 15 |

Referring to Table 6, the polishing rate of the phase change layer was higher for Example B than for Comparative Example B1 and Comparative Example B2. The polishing rate of the silicon nitride layer was lower for Example B than for Comparative Example B1 and Comparative Example B2. A polishing selectivity of the phase change layer with respect to the silicon nitride layer was higher for Example B than for Comparative Example B1 and Comparative Example B2. In certain embodiments, the polishing composition may include the first additive and the second additive, allowing the phase change layer to have an increased polishing selectivity with respect to the silicon nitride layer.

Table 7 shows removal rates of the germanium (Ge), antimony (Sb), and tellurium (Te) layers, which removal rates were measured at 25° C., when using the polishing compositions individually prepared according to Comparative Example B1, Comparative Example B2, and Example B.

TABLE 7

|  | Removal rate of Ge layer (Å/min) | Removal rate of Sb layer (Å/min) | Removal rate of Te layer (Å/min) |
| --- | --- | --- | --- |
| Comparative Example B1 | 1 | 19 | 27 |
| Comparative Example B2 | 1 | 31 | 9 |
| Example B | 1 | 20 | 7 |

Table 8 shows removal rates of the germanium (Ge), antimony (Sb), and tellurium (Te) layers, which removal rates were measured at 45° C., when using the polishing compositions individually prepared according to Comparative Example B1, Comparative Example B2, and Example B.

TABLE 8

|  | Removal rate of Ge layer (Å/min) | Removal rate of Sb layer (Å/min) | Removal rate of Te layer (Å/min) |
| --- | --- | --- | --- |
| Comparative Example B1 | 12 | 59 | 70 |
| Comparative Example B2 | 2 | 60 | 73 |
| Example B | 1 | 20 | 52 |

Referring to Tables 7 and 8, the removal rates of the Ge, Sb, and Te layers of Example B were respectively different from those of the Ge, Sb, and Te layers of Comparative Example B1 and Comparative Example B2. The removal rates of the Ge, Sb, and Te layers of Comparative Example B1 were respectively different from those of the Ge, Sb, and Te layers of Comparative Example B2. The removal rates of the Ge, Sb, and Te layers may be determined based on kinds and amounts of the chelating agent, the first additive, and the second additive. The phase change layer may include one or more of Ge, Sb, and Te. In certain embodiments, the kinds and amounts of the chelating agent, the first additive, and the second additive may be controlled in accordance with kinds and amounts of phase change materials contained in the phase change layer. Accordingly, the phase change layer may increase in polishing rate and may be uniformly polished.

Table 9 shows measured results of polishing rates of the phase change layer, polishing rates of the silicon nitride layer, and particle sizes of the abrasive when using the polishing compositions individually prepared according to Comparative Example B1, Comparative Example C1, Comparative Example C2, Comparative Example C3, and Example B.

TABLE 9

|  | Polishing rate of phase change (GST) layer (Å/min) | Polishing rate of silicon nitride (Si$_3$N$_4$) layer (Å/min) | Particle size of abrasive (nm) |
| --- | --- | --- | --- |
| Comparative Example B1 | 293 | 30 | 41 |
| Comparative Example C1 | 292 | 124 | 86 |
| Comparative Example C2 | 311 | 132 | 92 |
| Comparative Example C3 | 352 | 152 | 2200 (precipitate) |
| Example B | 294 | 9 | 45 |

Referring to Table 9, the particle size of the abrasive was greater for Comparative Examples C1, C2, and C3 than for Example B. Comparative Example C1, C2, and C3 included a second additive whose compositional ratio was greater than about 100 ppm. Comparative Example C3 further includes a first additive whose compositional ratio was greater than about 100 ppm, and particles of the abrasive were precipitated. Example B included a first additive and a second additive each of which had a compositional ratio of less than about 100 ppm. Accordingly, the abrasive was prevented from being aggregated.

The polishing rate of the silicon nitride layer was lower for Example B than for Comparative Example C1, Comparative Example C2, and Comparative Example C3. A polishing selectivity of the phase change layer with respect to the silicon nitride layer was higher for Example B than for Comparative Example C1, Comparative Example C2, and Comparative Example C3.

By way of summation and review, with an increase in integration of semiconductor devices, non-uniformity between components of semiconductor devices during their manufacture could a great effect on reliability and electrical characteristics of semiconductor devices.

According to an embodiment, a phase change layer may have a high polishing selectivity with respect to an interlayer dielectric layer in a polishing process in which a polishing composition according to an embodiment is used.

Phase change patterns may have top surfaces at substantially the same level (e.g., coplanar) in a polishing process using the polishing composition. The interlayer dielectric layer may have a top surface at substantially the same level as those of the top surfaces of the phase change patterns. As a result, a semiconductor device may exhibit increased reliability.

One or more embodiments may provide a polishing composition used for polishing a phase change layer.

One or more embodiments may provide a method of forming phase change patterns having a uniform thickness.

One or more embodiments may provide a method of fabricating a semiconductor device with improved reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A polishing composition, comprising:
   an abrasive;
   a first additive, the first additive including N-lauroylethyenediamine; and
   a second additive that includes a sulfonic acid having 1 to 7 carbon atoms, a sulfonate having 1 to 7 carbon atoms, or a sulfonate salt having 1 to 7 carbon atoms.

2. The polishing composition as claimed in claim 1, wherein the first additive is included in the composition in an amount of 1 ppm to 100 ppm by mass.

3. The polishing composition as claimed in claim 1, wherein the second additive includes a substituted or unsubstituted C1 to C7 alkyl sulfonic acid, a substituted or unsubstituted C1 to C7 aromatic sulfonic acid, a substituted or unsubstituted C1 to C7 alkyl sulfonate, a substituted or unsubstituted C1 to C7 aromatic sulfonate, a substituted or unsubstituted C1 to C7 alkyl sulfonate salt, or a substituted or unsubstituted C1 to C7 aromatic sulfonate salt.

4. The polishing composition as claimed in claim 1, further comprising a chelating agent.

5. The polishing composition as claimed in claim 4, wherein the chelating agent includes iminodiacetic acid, nitrilotriacetic acid, ethylenediaminetetraacetic acid, ethylenediaminetetraacetic acid, methylglycinediacetic acid, trans-1,2-diaminocyclohexane-N,N,N',N'-tetraacetic acid, 1,2-diaminopropane-N,N,N,N-tetraacetic acid, ethylene glycol-bis(2-aminoethylether)-N,N,N,N-tetraacetic acid, 2-phosphonobutane-1,2,4-tricarboxylic acid, or N,N-bis(2-hydroxybenzyl)ethylenediamine-N,N-diacetic acid.

6. The polishing composition as claimed in claim 1, wherein the second additive is included in the composition in an amount of 1 ppm to 100 ppm by mass.

7. The polishing composition as claimed in claim 1, further comprising an oxidizing agent.

8. The polishing composition as claimed in claim 1, wherein a pH of the polishing composition is 2.5 to 4.0.

9. The polishing composition as claimed in claim 1, wherein the polishing composition has a polishing rate that is higher with respect to a phase change material than for a silicon containing dielectric material under like polishing conditions.

10. A polishing composition, comprising:
    an abrasive including one or more of silica and alumina;
    a first additive, the first additive including N-lauroylethyenediamine; and
    a second additive that includes a sulfonic acid having 1 to 7 carbon atoms, a sulfonate having 1 to 7 carbon atoms, or a sulfonate salt having 1 to 7 carbon atoms, a compositional ratio of the second additive falling within a range from 1 ppm to 100 ppm by mass.

11. The polishing composition as claimed in claim 10, further comprising one or more of iminodiacetic acid, nitrilotriacetic acid, ethylenediaminetetraacetic acid, ethylenediaminetetraacetic acid, methylglycinediacetic acid, trans-1,2-diaminocyclohexane-N,N,N',N'-tetraacetic acid, 1,2-diaminopropane-N,N,N,N-tetraacetic acid, ethylene glycol-bis(2-aminoethylether)-N,N,N,N-tetraacetic acid, 2-phosphonobutane-1,2,4-tricarboxylic acid, and N,N-bis(2-hydroxybenzyl)ethylenediamine-N,N-diacetic acid.

12. The polishing composition as claimed in claim 10, wherein the second additive includes a substituted or unsubstituted alkyl sulfonic acid having 1 to 7 carbon atoms, a substituted or unsubstituted aromatic sulfonic acid having 1 to 7 carbon atoms, a substituted or unsubstituted alkyl sulfonate having 1 to 7 carbon atoms, a substituted or unsubstituted aromatic sulfonate having 1 to 7 carbon atoms, a substituted or unsubstituted alkyl sulfonate salt having 1 to 7 carbon atoms, or a substituted or unsubstituted aromatic sulfonate salt having 1 to 7 carbon atoms.

13. The polishing composition as claimed in claim 10, further comprising a peroxide compound.

14. A polishing composition, comprising:
    an abrasive;
    a first additive, the first additive including N-lauroylethyenediamine, a compositional ratio of the first additive falling within a range from 1 ppm to 100 ppm by mass; and
    a second additive that includes one or more of sulfonic acid, sulfonate, and sulfonate salt, wherein a compositional ratio of the second additive falls within a range from 1 ppm to 100 ppm by mass.

15. The polishing composition as claimed in claim 14, wherein a composition ratio of the abrasive is 0.1 wt % to 10 wt %.

16. The polishing composition as claimed in claim 14, further comprising an oxidizing agent, wherein a composition ratio of the oxidizing agent is 0.1 wt % to 5.0 wt %.

17. The polishing composition as claimed in claim 14, wherein a pH of the polishing composition is in a range from 2.5 to 4.0.

* * * * *